United States Patent
Finocchiaro et al.

(10) Patent No.: US 11,411,566 B2
(45) Date of Patent: Aug. 9, 2022

(54) CHARGE PUMP

(71) Applicant: Texas Instruments Incorporated, Dallas, TX (US)

(72) Inventors: Salvatore Luciano Finocchiaro, Dallas, TX (US); Tolga Dine, Dallas, TX (US); Gerd Schuppener, Allen, TX (US); Siraj Akhtar, Richardson, TX (US); Swaminathan Sankaran, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/397,954

(22) Filed: Aug. 9, 2021

(65) Prior Publication Data

US 2021/0376838 A1  Dec. 2, 2021

Related U.S. Application Data

(62) Division of application No. 16/731,739, filed on Dec. 31, 2019, now Pat. No. 11,088,696.

(51) Int. Cl.
*H03L 7/089* (2006.01)
*H02M 3/07* (2006.01)
*H03L 7/087* (2006.01)

(52) U.S. Cl.
CPC .......... *H03L 7/0891* (2013.01); *H02M 3/073* (2013.01); *H03L 7/087* (2013.01)

(58) Field of Classification Search
CPC ....... H03L 7/0891; H03L 7/087; H02M 3/073
See application file for complete search history.

(56) References Cited

U.S. PATENT DOCUMENTS

| | | | | |
|---|---|---|---|---|
| 4,847,519 A | * | 7/1989 | Wahl | G05F 3/22 327/536 |
| 5,663,686 A | * | 9/1997 | Tada | G05F 3/222 327/157 |
| 5,877,651 A | * | 3/1999 | Furutani | G11C 8/08 327/538 |
| 6,222,402 B1 | * | 4/2001 | Boerstler | H03L 7/0896 327/157 |
| 6,529,082 B1 | * | 3/2003 | Boerstler | H03L 7/0896 331/17 |

(Continued)

*Primary Examiner* — Adam D Houston
(74) *Attorney, Agent, or Firm* — Michael A. Davis, Jr.; Charles A. Brill; Frank D. Cimino (57) ABSTRACT

In described examples, a method of operating a charge pump includes a first control signal deactivating a first transistor, and the first control signal's logical complement activating a second transistor to reset the first transistor's DC bias voltage. The first control signal's logical complement deactivates the second transistor, and the first control signal provides a bias voltage to the first transistor to activate it, causing current to be transmitted from an input voltage to an output terminal. A second control signal deactivates a third transistor, and the second control signal's logical complement activates a fourth transistor to reset the second transistor's DC bias voltage. The second control signal's logical complement deactivates the fourth transistor, and the second control signal provides a bias voltage to the third transistor to activate it, causing current to be transmitted from the output terminal to a ground.

14 Claims, 5 Drawing Sheets

(56) References Cited

U.S. PATENT DOCUMENTS

| | | | | |
|---|---|---|---|---|
| 6,646,493 B2* | 11/2003 | Butler | H02M 3/073 | 327/536 |
| 6,686,794 B1* | 2/2004 | Abidin | H03L 7/0896 | 327/536 |
| 7,446,596 B1* | 11/2008 | Fort | H02M 3/073 | 327/536 |
| 8,085,071 B2* | 12/2011 | Higashi | H03L 7/0816 | 327/157 |
| 9,496,880 B1* | 11/2016 | Yin | H03L 7/087 | |
| 2002/0175745 A1* | 11/2002 | Kim | H02M 3/073 | 327/536 |
| 2003/0151432 A1* | 8/2003 | Pelliconi | H02M 3/073 | 327/157 |
| 2003/0174010 A1* | 9/2003 | Pappalardo | H02M 3/073 | 327/536 |
| 2004/0066220 A1* | 4/2004 | Chen | H03L 7/0898 | 327/157 |
| 2004/0263238 A1* | 12/2004 | Thorp | H02M 3/073 | 327/536 |
| 2005/0093598 A1* | 5/2005 | Jeon | H03L 7/0816 | 327/158 |
| 2010/0039167 A1* | 2/2010 | Li | H02M 3/073 | 327/536 |
| 2011/0199136 A1* | 8/2011 | Tsai | H03L 7/0816 | 327/157 |
| 2011/0215787 A1* | 9/2011 | Shionoiri | H02M 3/158 | 323/311 |
| 2011/0254529 A1* | 10/2011 | van Straaten | H02M 1/44 | 323/311 |
| 2012/0154000 A1* | 6/2012 | Tabata | H03L 7/0898 | 327/157 |
| 2014/0049329 A1* | 2/2014 | Chen | H03L 7/089 | 331/1 R |
| 2020/0195242 A1* | 6/2020 | Shin | G11C 27/024 | |
| 2021/0057982 A1* | 2/2021 | Liu | H02M 3/07 | |
| 2021/0067034 A1* | 3/2021 | Yang | H02M 3/07 | |
| 2021/0203329 A1* | 7/2021 | Finocchiaro | H03L 7/0895 | |

* cited by examiner

CHARGE PUMP

CROSS-REFERENCE TO RELATED APPLICATION

This application is a divisional of U.S. patent application Ser. No. 16/731,739 filed Dec. 31, 2019, which is incorporated herein by reference.

TECHNICAL FIELD

This relates generally to electronic circuitry, and more particularly to a method and circuitry for a charge pump.

BACKGROUND

Figure 1:
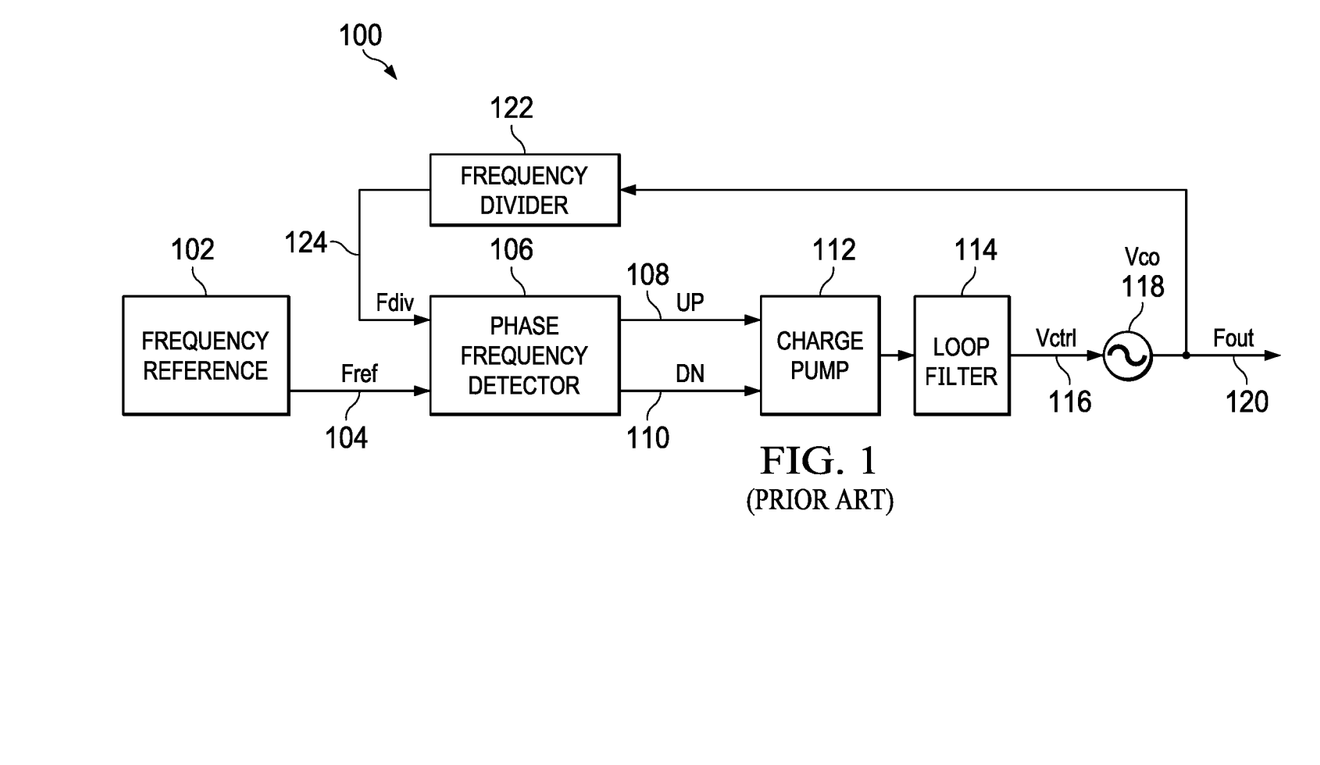
FIG. 1 (prior art) shows an example of a functional block layout for a phase locked loop (PLL).

FIG. 1 (prior art) shows an example of a functional block layout for a phase locked loop 100 (PLL). A frequency reference 102 is connected to output a reference signal 104 at a reference frequency Fref to a phase frequency detector 106 (PFD). The PFD 106 determines a difference between a phase and frequency of the reference signal 104 (at reference frequency Fref), and a phase and frequency of a feedback signal 124 at a feedback frequency Fdiv. Depending on the determined difference, the PFD 106 produces pulse width modulation (PWM) signals, an up signal 108 (UP), and a down signal 110 (DN). The UP 108 and DN 110 signals are further described with respect to FIG. 2. Generally, while the PFD 106 may detect no phase or frequency difference in a particular detection cycle, changing circuit conditions (such as changing input voltage or temperature) will cause the frequency and phase of the feedback signal 124 to drift. As a result, the PFD 106 will detect phase and frequency differences in later detection cycles.

The PFD 106 is connected to output the PWM signals UP 108 and DN 110 to a charge pump 112. The charge pump 112 uses the UP and DN signals 108, 110 to produce a current, which is output to a loop filter 114. Function of the charge pump 112 is further described with respect to FIG. 3. The loop filter 114 filters the current output by the charge pump 112 and outputs the result as a control voltage 116 (Vctrl) to a voltage controlled oscillator 118 (VCO). The loop filter 114 can be, for example, a low pass filter such as a capacitor. Vctrl 116 tunes the output of the VCO 118. The output of the VCO 118 is an output signal 120 with an output frequency Fout. The VCO 118 is connected to output the output signal 120 to a frequency divider 122. The frequency divider 122 divides the frequency of the output signal 120 Fout by a factor N (a number), producing the feedback signal 124 with a frequency $$Fdiv = \frac{Fout}{N}.$$

The output frequency of the PLL 100 is generated in response to comparison by the PFD 106 between the reference signal 104, which has frequency Fref, and the feedback signal 124, which has frequency $$\frac{Fout}{N}.$$

When the PLL 100 phase locks, Fout has reached a stable state such that the frequency of the reference signal 104 equals the frequency of the feedback signal 124. Therefore, when the PLL 100 phase locks, the output frequency Fout of the PLL 100 is Fout=N×Fref. Adding a second frequency divider (not shown) connected to receive the output of the VCO 118, and configured to divide Fout by a factor M, enables generation of a signal with broadly selectable frequency $$F = \frac{N}{M} \times Fref.$$

Because of the wide selectability of their output frequency with respect to their reference frequency, PLLs 100 are also called frequency synthesizers.

Figure 2:
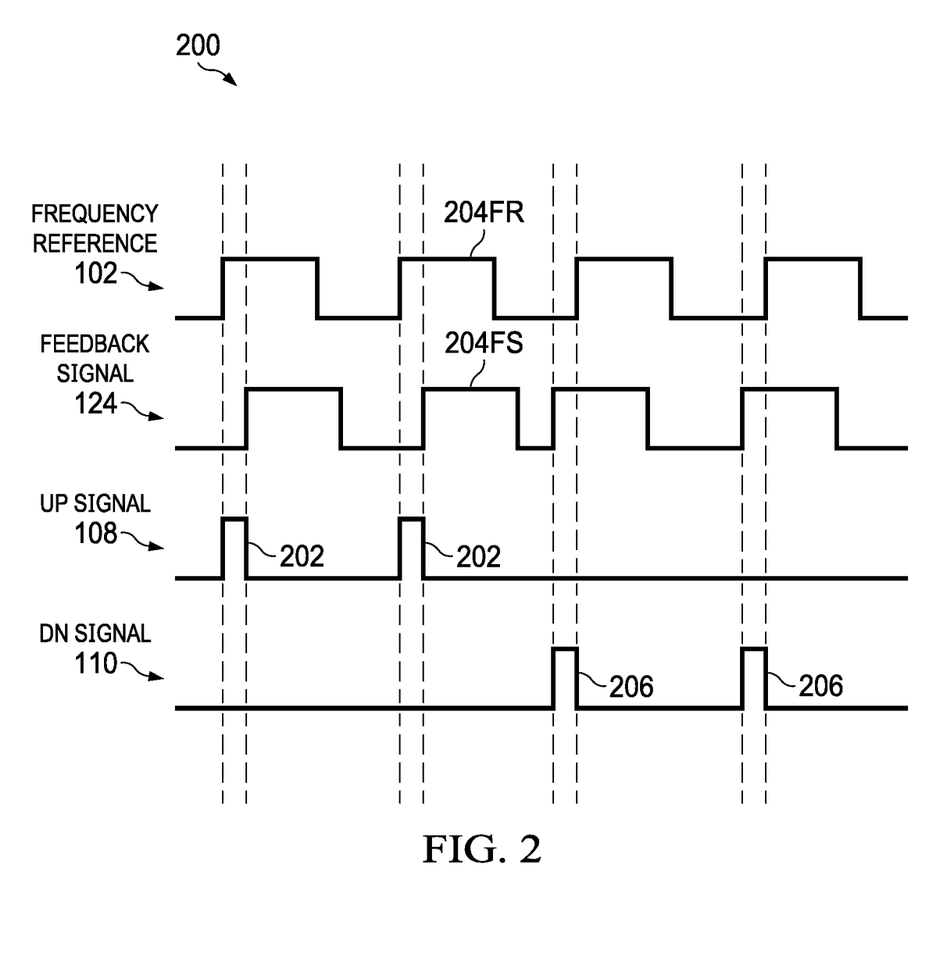
FIG. 2 shows an example timing plot for the phase frequency detector (PFD) and charge pump of FIG. 1.

FIG. 2 shows an example timing plot 200 for the PFD 106 and charge pump 112 of FIG. 1. The PFD 106 generates an UP pulse 202 in the UP signal 108 starting when a rising edge 204FR in the frequency reference 102 leads a rising edge 204FS in the feedback signal 124, and ending at the feedback signal's 124 lagging rising edge 204FS. (Vertical dotted lines are included to facilitate comparison of timing of rising edges.) The PFD 106 generates a DN pulse 206 in the DN signal 110 starting when a rising edge 204FS in the feedback signal 124 leads a rising edge 204FR in the frequency reference 102, and ending at the frequency reference's 102 lagging rising edge 204FR. Each leading rising edge 204 that triggers either an UP or DN pulse is the next rising edge 204 of the frequency reference 102 or the feedback signal 124 that follows an UP or DN pulse 202, 206. In practice, UP pulses 202 and DN pulses 206 can overlap as a result of, for example, delays in the PFD 106.

Figure 3:
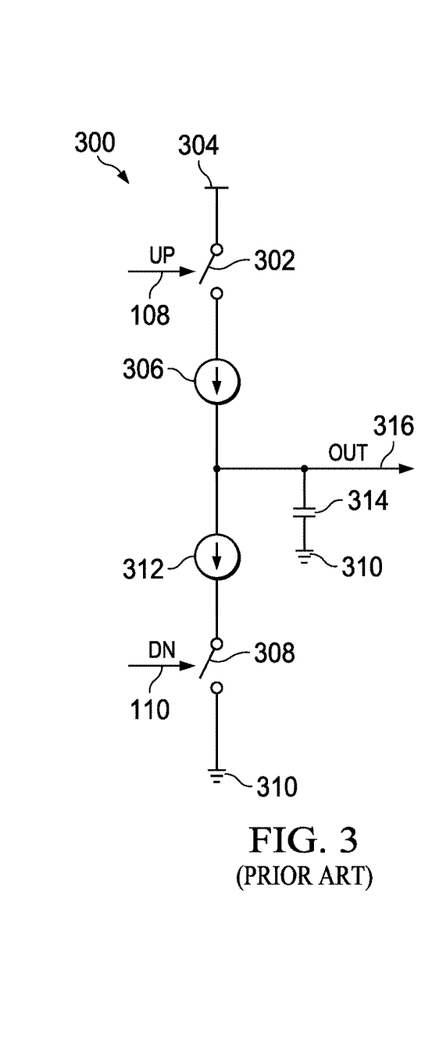
FIG. 3 (prior art) schematically shows an example of a charge pump.

FIG. 3 (prior art) schematically shows an example of a charge pump 300, which may be implemented as the charge pump 112 in FIG. 1. The FIG. 3 charge pump 300 has an UP switch 302 connected on a first end to an input voltage node 304 and on a second end to a first terminal of an UP current source 306. The charge pump 300 has a DN switch 308 connected on a first end to a ground node 310 and on a second end to a second terminal of a DN current source 312. The UP signal 108 is connected to control the UP switch 302, and the DN signal 110 is connected to control the DN switch 308. A second terminal of the UP current source 306 and a first terminal of the DN current source 312 are each connected to the loop filter 114, represented here as a capacitor 314, and are also connected to an output node 316 (OUT). The UP and DN current sources 306, 312 are connected to a first plate of the capacitor 314, and a second plate of the capacitor 314 is connected to the ground node 310. Current flows from the first terminal to the second terminal of each of the UP and DN current sources 306, 312. OUT 316 is a voltage across the capacitor 314 and corresponds to Vctrl 116 in the PLL 100 of FIG. 1, which controls the VCO 118.

The UP and DN switches 302, 308 control flow of current from the UP and DN current sources 306, 312, respectively. The UP and DN signals 108, 110 act as pulse width modulation (PWM) control signals for the UP and DN switches 302, 308, respectively. The UP switch 302 and DN switch 308 are open when they do not receive an UP pulse 202 or a DN pulse 206, respectively. When the UP switch 302 is open, current does not flow from the UP current source 306. When the DN switch 308 is open, current does not flow from the DN current source 312. When the UP switch 302 receives an UP pulse 202, the UP switch 302 closes during the pulse duration and current flows from the input voltage node 304 to the output node 314, charging the capacitor 314 and increasing Vctrl 116. When the DN switch 308 receives a DN pulse 206, the DN switch 308 closes during the pulse duration and current flows from the output node 314 to the ground node 310, discharging the capacitor 314 and decreasing Vctrl 116. When an UP switch 302 receives an UP pulse 202 and a DN switch 308 receives a DN pulse 206 at the same time, generally, no current will flow to or from the output node 314.

A charge pump in which UP and DN switches, which control flow of current from UP and DN current sources, are between the UP and DN current sources (respectively) and the low pass filter (LPF) capacitor (or other LPF device(s)), is called an internal switch device (not shown). A charge pump such as the charge pump 300 shown in FIG. 3, in which the UP and DN switches 302, 308 are between the UP and DN current sources 306, 312 (respectively) and the input voltage node 304 and ground node 310 (respectively), is called an external switch device. The charge pumps 300, 400, 500, and 600 shown in FIGS. 3, 4, 5, and 6 are external switch devices.

In external switch devices, when the switch opens, there is a variable impedance between the switch and the input voltage or ground which becomes very high, limiting discharge of corresponding circuit nodes. This causes the switched current to fall (relatively) slowly—accordingly, instead of producing a sharp falling edge approximating a square wave, the current attenuates more slowly. In a timing diagram, slow signal fall would appear as a curve with a shallow falling slope. Fast signal rise and fall would generally appear as (a relatively close approximation of) a square wave. Slowly falling UP and DN currents (from UP and DN current sources 306, 312, respectively) can make it more difficult for the charge pump 112 to accurately tune the VCO 118.

SUMMARY

In described examples, a method of operating a charge pump includes a first control signal deactivating a first transistor, and the first control signal's logical complement activating a second transistor to reset the first transistor's DC bias voltage. The first control signal's logical complement deactivates the second transistor, and the first control signal provides a bias voltage to the first transistor to activate it, causing current to be transmitted from an input voltage to an output terminal. A second control signal deactivates a third transistor, and the second control signal's logical complement activates a fourth transistor to reset the second transistor's DC bias voltage. The second control signal's logical complement deactivates the fourth transistor, and the second control signal provides a bias voltage to the third transistor to activate it, causing current to be transmitted from the output terminal to a ground.

DETAILED DESCRIPTION OF EXAMPLE EMBODIMENTS

Each of FIGS. 4 through 8 schematically shows a respective example embodiment of a charge pump, as may be compared to the example conventional charge pump 300 shown in FIG. 3. The example charge pumps 400, 500 described with respect to FIGS. 4 and 5 (respectively) help to describe features further described with respect to FIGS. 6, 7, and 8. Accordingly, the example embodiment charge pumps of FIGS. 6, 7, and 8 may be implemented into larger designs, for example serving as the charge pump 112 (and possibly the loop filter 114) of FIG. 1. Some described embodiments enable some or all of improved signal response to switching, lowered breakdown voltage requirements for UP switches resulting in faster switching, reduced device area usage, reduced output signal noise, lowered power requirements, and reduced design complexity. In FIGS. 4, 5, 6, 7, and 8, similar features are given the same item numbers.

Figure 4:
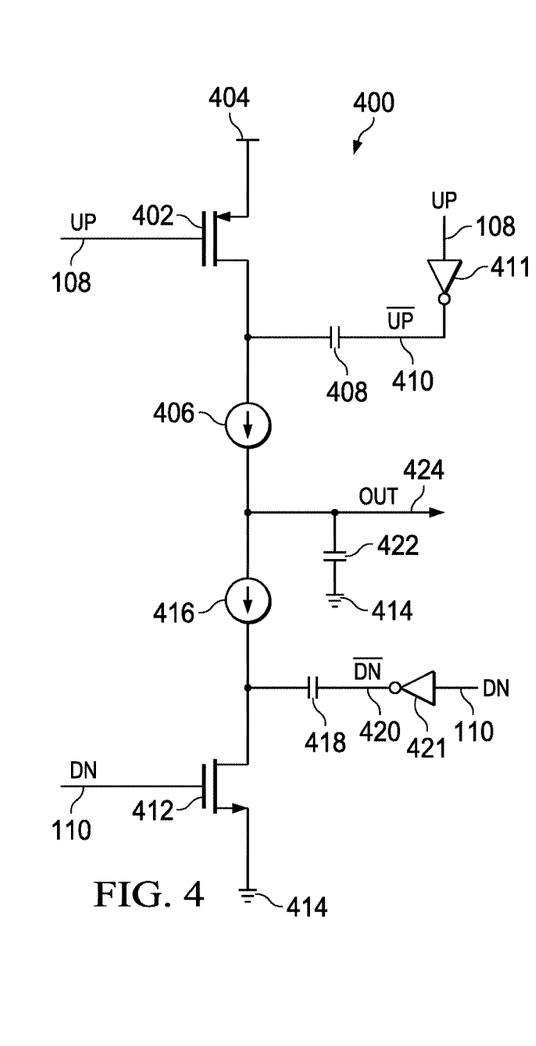
FIG. 4 schematically shows an example of a charge pump.

The FIG. 4 charge pump 400 has an NMOS UP transistor 402. The source of the UP transistor 402 is connected to an input voltage node 404 that is configured to receive an input voltage. The drain of the UP transistor 402 is connected to a first terminal of an UP current source 406 and to a first plate of an $\overline{\text{UP}}$ capacitor 408. The UP signal 108 is connected to the gate of, and thereby controls, the UP transistor 402. A second plate of the $\overline{\text{UP}}$ capacitor 408 is connected to the complement (logical complement) of the UP signal 108, referred to herein as the $\overline{\text{UP}}$ signal 410. Accordingly, when the UP signal 108 is high, the $\overline{\text{UP}}$ signal 410 is low, and when the UP signal 108 is low, the $\overline{\text{UP}}$ signal 410 is high, as further described below.

The charge pump 400 has a PMOS DN transistor 412. The source of the DN transistor 412 is connected to a ground node 414 that is configured to be connected to a ground (or other low reference potential). The drain of the DN transistor 412 is connected to a second terminal of a DN current source 416 and to a first plate of a $\overline{\text{DN}}$ capacitor 418. The DN signal 110 is connected to the gate of, and thereby controls, the DN transistor 412. A second plate of the $\overline{\text{DN}}$ capacitor 418 is connected to the complement (logical opposite) of the DN signal 110, referred to herein as the $\overline{\text{DN}}$ signal 420. As shown in FIG. 4, the UP signal 410 is connected to an input of an UP logical inverter 411, which outputs the $\overline{\text{UP}}$ signal 410; and the DN signal 420 is connected to the input of a DN logical inverter 421, which outputs the $\overline{\text{DN}}$ signal 420. (Accordingly, $\overline{\text{UP}}$ and $\overline{\text{DN}}$ signals can be generated by, for example, logical inverters, which are not shown in other figures for clarity.)

A second terminal of the UP current source 406 and a first terminal of the DN current source 416 are each connected to a loop filter (e.g., the loop filter 114 of FIG. 1), represented here as a low pass filter (LPF) capacitor 422. The second terminal of the UP current source 406 and the first terminal of the DN current source 416 are also connected to an output node 424 (OUT). The UP and DN current sources 406, 416 are connected to a first plate of the LPF capacitor 422, and a second plate of the LPF capacitor 422 is connected to the ground node 414. Current flows from the first terminal to the second terminal of each of the UP and DN current sources 406, 416. In the PLL 400 of FIG. 4, OUT 424 may correspond to the FIG. 1 VCO 118 input, in which case the voltage across the LPF capacitor 422 corresponds to Vctrl 116.

The $\overline{UP}$ signal 410 is complementary to the UP signal 108. When the UP signal goes low, the NMOS UP transistor 402 switches off (is deactivated; note that generally, NMOS is activated by a high gate signal). At the same time that UP signal 108 is low, the $\overline{UP}$ signal 410 goes high and charges the capacitor 408, as well as adding current at (and charging a voltage at a node corresponding to) the UP transistor 402 drain and the first terminal of the UP current source 406. Complementary operation of the preceding occurs with respect to the DN PMOS transistor 412. Accordingly, when the DN signal 110 goes high, the PMOS DN transistor 110 switches off (is deactivated; note that generally, PMOS is activated by a low gate signal). At the same time that the DN signal 110 is high, the $\overline{DN}$ signal 420 goes low charging capacitor 418, as well as adding current at (and charging a voltage at a node corresponding to) the DN transistor 412 drain and the second terminal of the DN current source 416. These additional $\overline{UP}$ signal 410 and $\overline{DN}$ signal 420 currents start flowing when the UP signal 108 goes low and the DN signal 110 goes high, and stop flowing when the UP signal 108 goes high and the DN signal 110 goes low (respectively). Charging transistor drains changes respective gate-to-drain voltages, changing the voltages needed to be applied to respective gates to meet gate thresholds and turn the transistors on. The currents added by the $\overline{UP}$ and $\overline{DN}$ signals 410, 420 via $\overline{UP}$ and $\overline{DN}$ capacitors 408, 418 also help to discharge corresponding nodes (the first terminal of the UP current source 406 and the second terminal of the DN current source 416, respectively), enabling faster signal fall-off (sharper falling edges) when the UP and DN transistors 108, 110 (respectively) turn off. Here, $\overline{UP}$ signal 410 and $\overline{DN}$ signal 420 currents lower the change in voltage required to turn on the UP and DN transistors 402, 412, accelerating UP and DN transistor 402, 412 activation.

Noise within the loop bandwidth of a PLL is generally transferred to the output multiplied by $N^2$, where N is a value by which the reference frequency is multiplied to produce an output frequency. (The multiplier N is also described above with respect to FIG. 1.) Accordingly, reducing N reduces the noise in a PLL output signal. N can be reduced by, for example, using a frequency reference operating at a high frequency (for example, Fref=2.5 GHz). In systems in which the charge pump 400 is used with a frequency reference operating at a high frequency, the UP and DN signals 108, 110 will typically oscillate at a similarly high frequency. As frequency of a current signal to a capacitor increases, effective impedance of the capacitor reduces—that is, the capacitor passes more charge across its plates, resulting in increased current flow across the capacitor. This effect facilitates provision of additional current by the $\overline{UP}$ and $\overline{DN}$ signals 410, 420 across the respective $\overline{UP}$ and $\overline{DN}$ capacitors 408, 418.

The additional current contributed by the $\overline{UP}$ and $\overline{DN}$ signals 410, 420 facilitates a more rapidly falling edge of the current signal from the respective UP or DN current source 406, 416 when the UP signal 108 goes low or the DN signal 110 goes high, turning off the respective UP or DN transistor 402, 412. The sharper falling edge of the current signal results from, for example, the $\overline{UP}$ or $\overline{DN}$ signal 410, 420 causing the parasitic capacitance of the respective UP and DN transistor 402, 412 to discharge more rapidly. The current signal falling more rapidly when the respective UP or DN transistor 402, 412 turns off (opens) corresponds to the OUT 424 voltage signal more closely approximating a square wave. Fast rise and fall of switched charge pump current may improve, for example, the resolution in control of the FIG. 1 VCO 118, reduce leakage, and reduce noise, including in systems operating at high frequencies.

Figure 5:
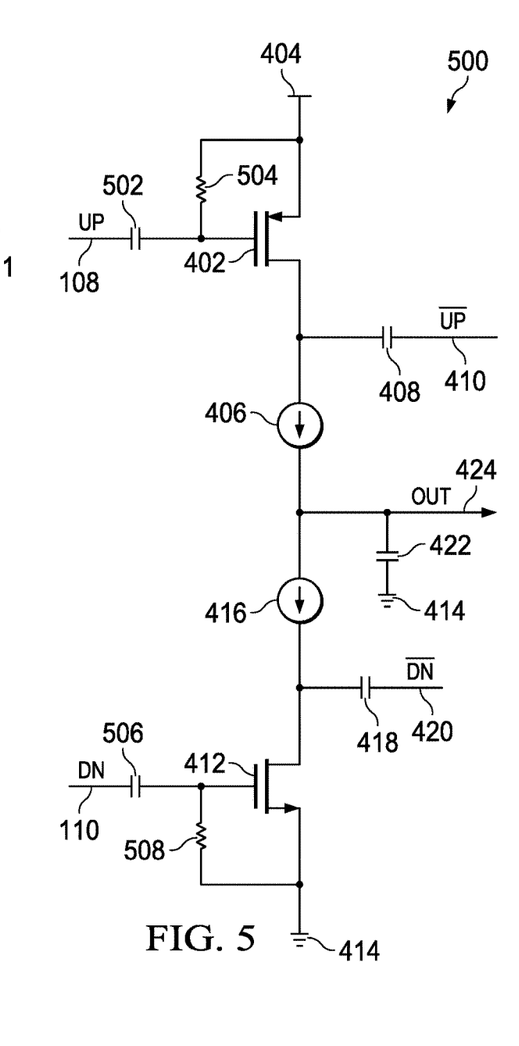
FIG. 5 schematically shows an example of a charge pump.

FIG. 5 schematically shows an example embodiment of a charge pump 500. Structures in FIG. 5 which are similar to the structures in FIG. 4 in form and function are given the same item number. In FIG. 5, the UP signal 108 is electrically connected to a first plate of an UP capacitor 502. A second plate of the UP capacitor 502 is connected via an UP bias coupling resistor 504 to both the input voltage node 404 and to the source of the UP transistor 402, and it is also connected to the gate of the UP transistor 402. Accordingly, the UP signal 108 is AC coupled to the UP transistor 402 by the UP capacitor 502. Similarly, the DN signal 110 is electrically connected to a first plate of a DN capacitor 506. A second plate of the DN capacitor 506 is connected via a DN bias coupling resistor 508 to both ground node 414 and to the source of the DN transistor 412, and it is also connected to the gate of the DN transistor 412. Accordingly, the DN signal 110 is AC coupled to the DN transistor 412 by the DN capacitor 506.

AC coupling enables the charge carried by the UP and DN signals 108, 110 to be transmitted across the respective UP and DN capacitors 502, 506 with low impedance, while isolating the UP and DN transistors 402, 412 from DC components of the UP and DN signals 108, 110. This enables fast control of the UP and DN transistors 402, 412, enabling more nearly ideal OUT 424 signal edges (rising and falling with a signal shape more closely conforming to a designed output signal shape). Further, the UP and DN bias coupling resistors 504, 508 act as level shifters, enabling use of lower bias voltage—and, accordingly, faster—UP and DN transistors 402, 412. (Faster turn on/activation and faster turn off/deactivation.) Accordingly, the UP and DN signals 108, 110 may be implemented as relatively low voltage signals, for example, digital control signals output by a phase frequency detector.

Use of low voltage signals to control the UP and DN transistors 402, 412 is facilitated by coupling the gates of the UP and DN transistors 402, 412 to a direct current (DC) bias voltage. DC bias voltages are stored by the UP and DN capacitors 502, 506, and provide a voltage $V_{DC}$, where $V_{DC}$ is the DC bias voltage. The UP transistor 402 is biased by connection of its gate to the input voltage node 404 via the UP bias coupling resistor 504. When the UP signal 108 is low, the voltage at the gate of the UP transistor 402 equals the input voltage received by the input voltage node 404, $V_{dd}$, so that the voltage between the gate and source of the UP transistor 402 ($V_{GS}$) equals zero, and the UP transistor 402 is off (the switch is open). The UP capacitor 502 isolates the gate of the UP transistor 402 from the source of the UP signal 108, so that the UP signal 108 can be at (for example) zero voltage while the gate of the UP transistor 402 is at $V_{dd}$. When the UP signal 108 is high, the voltage at the gate of the UP transistor 402 equals $V_{dd}-V_{UP}$, and $V_{GS}=V_{dd}-(V_{dd}-V_{UP})=V_{UP}$. The threshold voltage for the UP transistor 402, $V_{TH}$, can be selected so that $V_{UP}>V_{TH}$, and the UP transistor 402 turns on (the switch is closed) when the UP signal 108 is high.

The UP portion of the charge pump 500 (in FIG. 5, from the UP current source 406 upwards) is configured to be symmetrical with the DN portion 512 of the charge pump 500 (in FIG. 5, from the DN current source 416 downwards), so that UP current pulses delivered using the UP current source 406 when the UP signal 108 is high will match DN current pulses delivered using the DN current source 416 when the DN signal 110 is low. Similarly, the voltage of the UP signal 108, $V_{UP}$, is selected to be equal to the voltage of the DN signal 110, $V_{DN}$. The DN transistor 412 is biased by connection of its gate to the ground node 414 via the DN bias coupling resistor 508. When the DN signal 110 is low, the voltage at the gate of the DN transistor 412 equals the ground voltage received by the ground node, $V_{GND}$, so that the voltage between the gate and source of the DN transistor 402 equals zero, and the DN transistor 412 is on (the switch is closed). The DN capacitor 506 isolates the gate of the DN transistor. When the DN signal 110 is high, the voltage at the gate of the DN transistor 412 equals $V_{DN}$, and the DN transistor 412 is off (the switch is open). Accordingly, low voltage switching devices can be used while avoiding use of level shifting stages, because the UP transistor 108 and the DN transistor 110 will generally have voltage swings equal to $V_{UP}=V_{DN}$, including when $V_{UP}$ and $V_{DN}$ are less than $V_{DD}$.

Low voltage UP and DN transistors 402, 412 enable faster switching, and a higher output voltage range in a charge pump using such fast switching. Faster switching is due to, for example, low bias voltage transistors generally switching faster than high voltage bias transistors, and smaller voltage changes generally completing faster than larger voltage changes. The output voltage range in a charge pump is generally limited by the voltage dissipated from the input voltage node to the ground node of the charge pump. Higher output voltage range is enabled by, for example, being able to use faster, lower voltage transistors without lowering the voltage difference between the input voltage and the ground to avoid reaching transistor breakdown voltages. The higher the voltage range of the charge pump, the lower the gain required between the charge pump output and the VCO output to generate a PLL output at a particular voltage. Higher gain generally results in increased noise in the PLL output, while lower gain generally results in lowered noise in the PLL output.

The DC bias voltage provided by the UP and DN bias coupling resistors 504, 508 in the charge pump 500 of FIG. 5 may drift, due to changing duty cycles of the UP and DN signals 108, 110. Duty cycles of the UP and DN signals 108, 110 may vary in a charge pump 500 used in a PLL, because the duty cycles depend on the frequency and phase difference between the frequency reference and the feedback signal. Accordingly, these changing duty cycles cause the amount of charge stored in the UP and DN capacitors 502, 506—the voltages at the gates of the UP and DN transistors 402, 412, respectively—to fluctuate when resistors are used to bias the UP and DN transistors 402, 412. Accordingly, the charge stored at the UP and DN capacitors 502, 506 can become $V_{DC}+V_{drift}$, where $V_{drift}$ is an increase in the gap between $V_{DC}$ and $V_{TH}$ caused by voltage drift. For large enough $V_{drift}$, this can result in $V_{GS}$ being too small (for the UP transistor 402) or too large (for the DN transistor 412) for the respective transistor to turn on. Using the UP transistor 412 as an example, with $V_{drift}$ included and the UP signal 108 high, $V_{GS}=V_{dd}-(V_{dd}+V_{drift}-V_{UP})=V_{UP}-V_{drift}$. Accordingly, drifting DC bias voltage delivered to the gates of the UP and DN transistors 402, 412 can cause the UP and DN transistors 402, 412 to stop switching. For example, DC bias voltage delivered to the UP and DN transistors 402, 412 in the charge pump 500 of FIG. 5 may drift and cause loss of function of the charge pump 500 of FIG. 5 if the UP and DN signals 108, 110 are provided by a phase frequency detector in a PLL, due to variable duty cycles of the UP and DN signals 108, 110.

Figure 6:
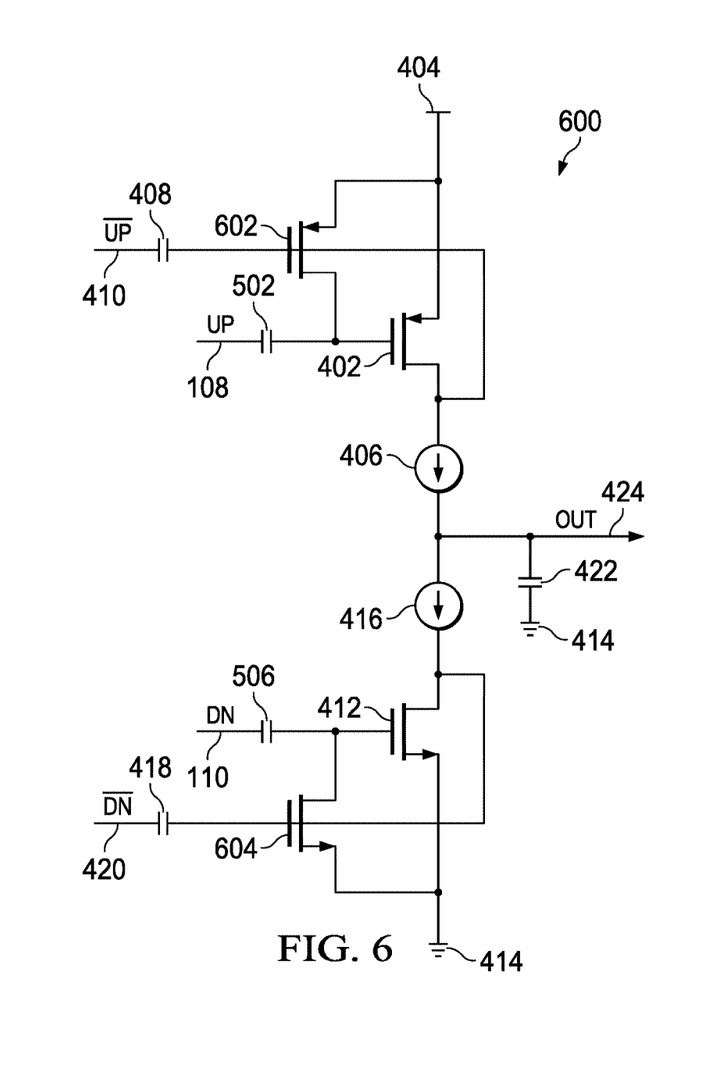
FIG. 6 schematically shows an example of a charge pump.

FIG. 6 schematically shows an example of a charge pump 600. As shown in FIG. 6, the UP signal 108 is electrically connected to the first plate of the UP capacitor 502. The second plate of the UP capacitor 502 is connected to the gate of the UP transistor 402, and to the drain of an NMOS $\overline{UP}$ transistor 602. The source of the $\overline{UP}$ transistor 602 is connected to the source of the UP transistor 402 and to the input voltage node 404. The $\overline{UP}$ signal 410 is connected to the first plate of the $\overline{UP}$ capacitor 408. The second plate of the $\overline{UP}$ capacitor 408 is connected to the gate of the $\overline{UP}$ transistor 602, the drain of the UP transistor 402, and the first terminal of the UP current source 406. The second terminal of the UP current source 406 is connected to the first terminal of the DN current source 416, the first plate of the LPF capacitor 422, and OUT 424. The second plate of the LPF capacitor 422 is connected to the ground node 414.

The DN signal 110 is electrically connected to the first plate of the DN capacitor 506. The second plate of the DN capacitor 506 is connected to the gate of the DN transistor 412, and to the drain of a PMOS $\overline{DN}$ transistor 604. The source of the $\overline{DN}$ transistor 604 is connected to the source of the DN transistor 412 and to the ground node 414. The $\overline{DN}$ signal 420 is connected to the first plate of the $\overline{DN}$ capacitor 418. The second plate of the $\overline{DN}$ capacitor 418 is connected to the gate of the $\overline{DN}$ transistor 604, the drain of the DN transistor 412, and the second terminal of the DN current source 416.

When the charge pump control signals—the UP signal 108 and the DN signal 110, and their complements—change at high frequency, the UP capacitor 502, DN capacitor 506, $\overline{UP}$ capacitor 408, and $\overline{DN}$ capacitor 418, pass the respective AC coupled signals (the UP signal 108, the DN signal 110, the $\overline{UP}$ signal 410, and the $\overline{DN}$ signal 420) to the gates of the respective transistors (the UP transistor 402, the DN transistor 412, the $\overline{UP}$ transistor 602, and the $\overline{DN}$ transistor 604). Charge pump control signals will generally change with high frequency when the charge pump 600 is part of a system clocked by a frequency reference operating at high frequency.

The $\overline{UP}$ and $\overline{DN}$ transistors 602, 604 in the charge pump 600 of FIG. 6 serve a similar function to the UP and DN bias coupling resistors 504, 508 of FIG. 5. Additionally, the $\overline{UP}$ and $\overline{DN}$ transistors 602, 604 reset the DC bias delivered to the gates of the UP and DN transistors 402, 412 each time the $\overline{UP}$ and $\overline{DN}$ transistors 602, 604 are activated to connect the gates of the UP and DN transistors 402, 412 to the input voltage node 404 and the ground node 414, respectively. When the $\overline{UP}$ or $\overline{DN}$ transistor 602, 604 closes, causing the DC voltage bias to the UP or DN transistor 402, 412 (respectively) to reset, the gate of the UP or DN transistor 402, 412 is connected to the input voltage node 404 or the ground node 414 (respectively). This causes the voltage stored by the UP or DN capacitor 502, 506 at the corresponding gate to be reset from $V_{DC}+V_{drift}$ to $V_{DC}$. Accordingly, this reset function of the $\overline{UP}$ and $\overline{DN}$ transistors 602, 604 compensates for DC voltage bias drift so that the voltage provided by the UP or DN signal 108, 110 will cause the UP or DN transistor 402, 412 to activate. The $\overline{UP}$ transistor 602 also biases the UP transistor 402 to the input voltage node 404 with a high impedance when $\overline{UP}$ transistor 602 is off, and the $\overline{DN}$ transistor 604 also biases the DN transistor 412 to the ground node 414 with a high impedance when the DN transistor 412 is off.

The charge pump 600 of FIG. 6 is an external switch charge pump with current injection from $\overline{UP}$ and $\overline{DN}$ signals 410, 420, corresponding to similar features described by the charge pump 400 of FIG. 4. The charge pump 600 of FIG.

6 also includes AC coupling with a DC bias voltage to enable use of faster, lower voltage switch devices, corresponding to similar features described by the charge pump 500 of FIG. 5. The charge pump 600 of FIG. 6 further describes DC bias reset switches ($\overline{UP}$ and $\overline{DN}$ transistors 602, 604) which compensate for DC bias voltage drift.

Figure 7:
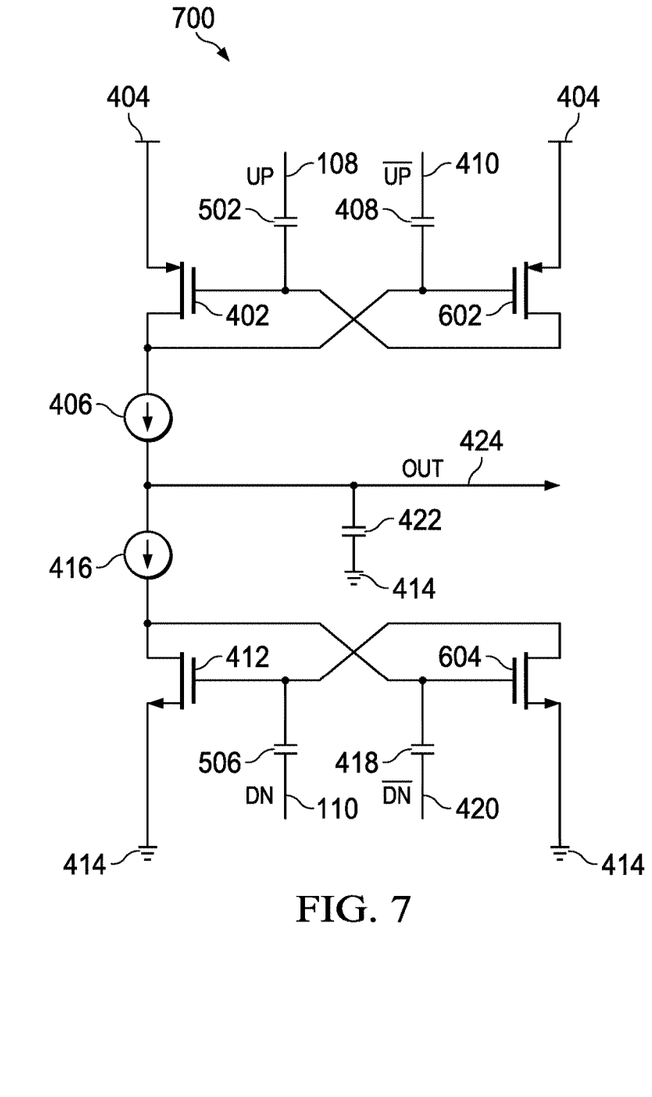
FIG. 7 schematically shows a view of the charge pump of FIG. 6.

FIG. 7 schematically shows a view 700 of the charge pump 600 of FIG. 6. In FIG. 7, the charge pump 600 of FIG. 6 is rearranged to show certain symmetries of the charge pump 600. As shown in FIG. 7, not only do the $\overline{UP}$ and $\overline{DN}$ signals 410, 420 reset the DC bias voltages of the UP and DN transistors 402, 412; but also, the UP and DN signals 108, 110 reset DC bias voltages of the $\overline{UP}$ and $\overline{DN}$ transistors 602, 604. Accordingly, $\overline{UP}$ and $\overline{DN}$ transistors 602, 604 can be operated with similar speed to the UP and DN transistors 402, 412, as described above.

Figure 8:
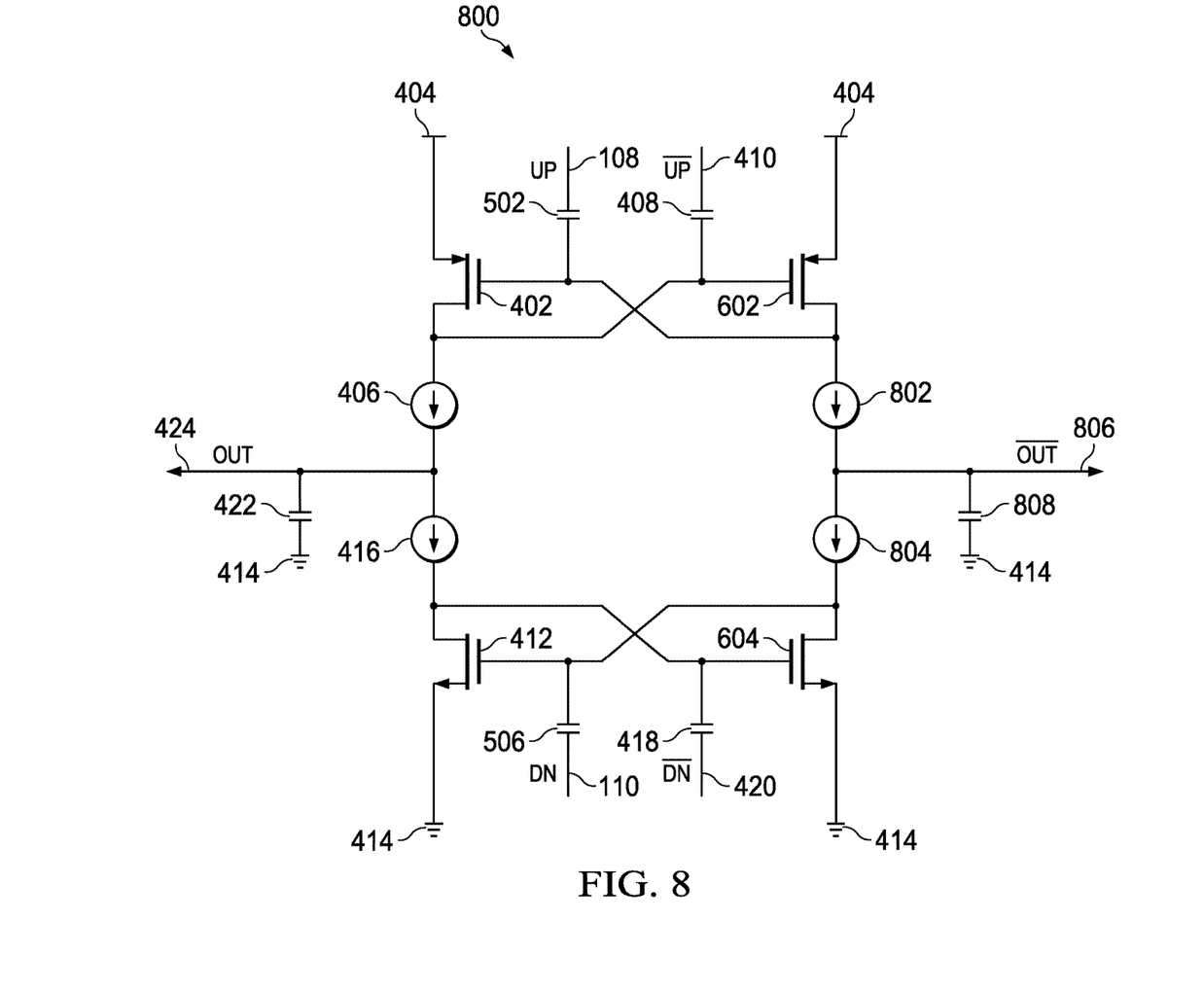
FIG. 8 schematically shows an example of a charge pump.

FIG. 8 schematically shows an example of a charge pump 800. As shown in FIG. 8, the UP signal 108 is electrically connected to the first plate of the UP capacitor 502. The second plate of the UP capacitor 502 is connected to the gate of the UP transistor 402, the drain of the $\overline{UP}$ transistor 602, and a first terminal of an $\overline{UP}$ current source 802. The source of the $\overline{UP}$ transistor 602 and the source of the UP transistor 402 are connected to the input voltage node 404. The $\overline{UP}$ signal 410 is connected to the first plate of the $\overline{UP}$ capacitor 408. The second plate of the $\overline{UP}$ capacitor 408 is connected to the gate of the $\overline{UP}$ transistor 602, the drain of the UP transistor 402, and the first terminal of the UP current source 406.

The second terminal of the UP current source 406 is connected to the first terminal of the DN current source 416, the first plate of the LPF capacitor 422, and OUT 424. The second plate of the LPF capacitor 422 is connected to the ground node 414. A second terminal of the $\overline{UP}$ current source 802 is connected to a first terminal of a $\overline{DN}$ current source 804, a complementary output node 806 providing a signal $\overline{OUT}$ (complement of OUT), and a first plate of a second LPF capacitor 808. A second plate of the second LPF capacitor 808 is connected to the ground node 414. $\overline{OUT}$ 806 receives a signal with opposite polarity—opposite current and opposite voltage—with respect to the signal received by OUT 424.

The DN signal 110 is electrically connected to the first plate of the DN capacitor 506. The second plate of the DN capacitor 506 is connected to the gate of the DN transistor 412, the drain of the PMOS $\overline{DN}$ transistor 604, and a second terminal of the $\overline{DN}$ current source 804. The source of the $\overline{DN}$ transistor 604 and the source of the DN transistor 412 are connected to the ground node 414. The $\overline{DN}$ signal 420 is connected to the first plate of the $\overline{DN}$ capacitor 418. The second plate of the $\overline{DN}$ capacitor 418 is connected to the gate of the $\overline{DN}$ transistor 604, the drain of the DN transistor 412, and the second terminal of the DN current source 416.

The OUT 424 signal and the $\overline{OUT}$ 806 signal can be used together as differential control signals to reduce signal noise in a waveform output by a VCO controlled by the OUT 424 signal and the $\overline{OUT}$ 806 signal (corresponding to Vctrl and $\overline{Vctrl}$ signals).

Modifications are possible in the described embodiments, and other embodiments are possible, within the scope of the claims.

In some embodiments, AC coupling capacitors can be relatively small with respect to charge pump device area.

In some embodiments, the input voltage is an analog voltage, and the UP and DN signals are digital voltages.

In some embodiments, a low voltage rail is used as a ground voltage.

In some embodiments, a resistive impedance can be used to couple the gate of the UP or DN transistor to the input voltage node or the ground node, respectively.

Modifications are possible in the described embodiments, and other embodiments are possible, within the scope of the claims.

What is claimed is:

1. A method of operating a charge pump, the method comprising:
   a) turning off a first transistor responsive to a first control signal, and turning on a second transistor responsive to a logical complement of the first control signal to reset a DC bias voltage of the first transistor to a voltage at an input terminal;
   b) turning off the second transistor responsive to the logical complement of the first control signal, and turning on the first transistor responsive to the first control signal when the first control signal changes to add a bias voltage $V_1$ to the first transistor in which the source-gate voltage of the first transistor equals $V_1$, and in which $V_1$ is greater than a threshold voltage of the first transistor; and in which, while the first transistor is turned on, the first transistor causes a first current source to conduct current from the input terminal to an output terminal;
   c) turning off a third transistor responsive to a second control signal, and turning on a fourth transistor responsive to a logical complement of the second control signal to reset a DC bias voltage of the second transistor to a voltage at a ground terminal; and
   d) turning off the fourth transistor responsive to the logical complement of the second control signal, and turning on the third transistor responsive to the second control signal when the second control signal changes to add a bias voltage $V_2$ to the third transistor in which the source-gate voltage of the third transistor equals $V_2$, and in which $V_2$ is greater than a threshold voltage of the third transistor; and in which, while the third transistor is turned on, the third transistor causes a second current source to conduct current from the output terminal to the ground terminal.

2. The method of claim 1, wherein turning on the second transistor connects the input terminal to the gate of the first transistor, and turning on the fourth transistor connects the ground terminal to the gate of the third transistor.

3. The method of claim 1, further comprising:
   AC coupling the first control signal to the first transistor; and
   AC coupling the second control signal to the third transistor.

4. The method of claim 1, further comprising low pass filtering a signal at the output terminal, and controlling a voltage controlled oscillator responsive to the low pass filtered signal.

5. The method of claim 1, further comprising using a phase frequency detector to generate the first control signal and the second control signal responsive to a comparison between a reference frequency and an output signal from the voltage controlled oscillator.

6. The method of claim 1, wherein:
   the output terminal is a first output terminal;
   the step a) turning on causes a third current source to conduct current from the input terminal to a second output terminal; and
   the step c) turning on causes a fourth current source to conduct current from the second output terminal to the ground terminal.

7. The method of claim 1, wherein, when the step b) turning on and the step d) turning on occur concurrently, no current is conducted to the output terminal.

8. A phase locked loop, comprising:
a frequency reference circuit having a reference frequency output, the frequency reference circuit configured to provide a reference frequency signal having a reference frequency at the reference frequency output;
a phase frequency detector (PFD) having a first PFD input, a second PFD input, a first PFD output and a second PFD output, the first PFD input coupled to the reference frequency output, the PFD configured to provide a first control signal at the first PFD output and a second control signal at the second PFD output responsive to a comparison between: the reference frequency; and a feedback signal at the second PFD input;
a charge pump (CP) comprising:
a first transistor having a first gate, a first source and a first drain;
a second transistor having a second gate, a second source and a second drain;
a third transistor having a third gate, a third source and a third drain;
a fourth transistor having a fourth gate, a fourth source and a fourth drain;
a first current source having first and second terminals;
a second current source having third and fourth terminals;
a first capacitor, a second capacitor, a third capacitor and a fourth capacitor, each of the first, second, third and fourth capacitors having a respective first plate and a respective second plate;
a first logical inverter having a first inverter input and a first inverter output; and
a second logical inverter having a second inverter input and a second inverter output;
in which the first plate of the first capacitor is coupled to the first PFD output, and the second plate of the first capacitor is coupled to the first gate and the second drain;
in which the first inverter input is coupled to the first PFD output, the first plate of the second capacitor is coupled to the first inverter output, and the second plate of the second capacitor is coupled to the second gate, the first drain and the first terminal;
in which the first source and the second source are coupled to an input voltage terminal;
in which the first plate of the third capacitor is coupled to the second PFD output, and the second plate of the third capacitor is coupled to the third gate and the fourth drain;
in which the second inverter input is coupled to the second PFD output, the first plate of the fourth capacitor is coupled to the second inverter output, and the second plate of the fourth capacitor is coupled to the fourth gate, the third drain and the fourth terminal; and
in which the third source and the fourth source are coupled to a ground terminal;
a loop filter having a loop filter input and a loop filter output, the loop filter input coupled to the second terminal and the third terminal; and
a voltage controlled oscillator (VCO) having a VCO input and a VCO output, the VCO input coupled to the loop filter output, the VCO output coupled to the second PFD input, and the VCO configured to provide the feedback signal at the VCO output.

9. The phase locked loop of claim 8, further comprising a frequency divider (FD) having an FD input and an FD output, the FD input coupled to the VCO output, the FD output coupled to the second PFD input, and the FD configured to: divide the feedback signal by a factor N to generate a divided feedback signal; and provide the divided feedback signal at the FD output.

10. The phase locked loop of claim 8, wherein the loop filter comprises a capacitor coupled to the ground terminal.

11. The phase locked loop of claim 8, wherein:
the loop filter is a first loop filter, the loop filter input is a first loop filter input, and the loop filter output is a first loop filter output;
the phase locked loop further comprises a second loop filter having a second loop filter input and a second loop filter output; and
the charge pump comprises:
a third current source having fifth and sixth terminals, the fifth terminal coupled to the second plate of the first capacitor, the first gate and the second drain; and
a fourth current source having seventh and eighth terminals, the eighth terminal coupled to the second plate of the third capacitor, the third gate and the second drain;
in which the second loop filter input is coupled to the sixth and seventh terminals.

12. The phase locked loop of claim 11, wherein the VCO input is a first VCO input, and the VCO has a second VCO input is coupled to the second loop filter output.

13. The phase locked loop of claim 11, wherein the VCO is configured to provide the feedback signal at the VCO output responsive to a differential between the first loop filter output and the second loop filter output.

14. A charge pump, comprising:
a first transistor having a first gate, a first source and a first drain;
a second transistor having a second gate, a second source and a second drain;
a first current source having first and second terminals;
a second current source having third and fourth terminals;
a first capacitor, a second capacitor, a third capacitor and a fourth capacitor, each of the first, second, third and fourth capacitors having a respective first plate and a respective second plate;
a first logical inverter having a first inverter input and a first inverter output;
a second logical inverter having a second inverter input and a second inverter output;
a first resistive impedance having a first end and a second end;
a second resistive impedance having a third end and a fourth end; and
control circuitry having a control output and first, second, third and fourth control inputs;
in which the first control input is adapted to be coupled to a first output of a phase frequency detector (PFD), the first control input is coupled to the first plate of the first capacitor, the second plate of the first capacitor is coupled to the first gate and the first end, and the second end is coupled to an input voltage terminal and the first source;
in which the second control input is coupled to the first inverter output, the first inverter input is adapted to be coupled to the first output of the PFD, the second control input is coupled to the first plate of the second capacitor, and the second plate of the second capacitor is coupled to the first drain and the first terminal;

in which the third control input is adapted to be coupled to a second output of the PFD, the third control input is coupled to the first plate of the third capacitor, the second plate of the third capacitor is coupled to the second gate and the third end, and the fourth end is coupled to a ground terminal and the second source;

in which the fourth control input is coupled to the second inverter output, the second inverter input is adapted to be coupled to the second output of the PFD, and the fourth control input is coupled to the second drain and the fourth terminal; and in which the control output is coupled to the second and third terminals.

\* \* \* \* \*